United States Patent
Toyoda et al.

(10) Patent No.: US 9,692,001 B2
(45) Date of Patent: Jun. 27, 2017

(54) DISPLAY DEVICE

(71) Applicant: Japan Display Inc., Tokyo (JP)

(72) Inventors: Hironori Toyoda, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/838,495

(22) Filed: Aug. 28, 2015

(65) Prior Publication Data
US 2016/0064683 A1 Mar. 3, 2016

(30) Foreign Application Priority Data
Sep. 1, 2014 (JP) .................. 2014-177013

(51) Int. Cl.
*H01L 51/50* (2006.01)
*H01L 27/32* (2006.01)

(52) U.S. Cl.
CPC ........ *H01L 51/504* (2013.01); *H01L 27/3206* (2013.01); *H01L 51/502* (2013.01)

(58) Field of Classification Search
CPC .................................................. H01L 51/504
See application file for complete search history.

(56) References Cited

U.S. PATENT DOCUMENTS

| 2003/0142048 | A1 | 7/2003 | Nishitani et al. | |
|---|---|---|---|---|
| 2005/0051766 | A1* | 3/2005 | Stokes | B82Y 10/00 257/17 |
| 2005/0194608 | A1* | 9/2005 | Chen | B82Y 10/00 257/100 |
| 2007/0075310 | A1* | 4/2007 | Lee | H01L 27/3211 257/40 |
| 2008/0001538 | A1* | 1/2008 | Cok | B82Y 20/00 313/506 |
| 2008/0224596 | A1* | 9/2008 | Park | C09K 11/612 313/503 |
| 2008/0296555 | A1* | 12/2008 | Miller | C09K 11/025 257/14 |
| 2011/0272713 | A1* | 11/2011 | Wirth | H01L 25/0753 257/81 |
| 2015/0228850 | A1* | 8/2015 | Zheng | H01L 33/40 257/13 |

FOREIGN PATENT DOCUMENTS

| JP | 2003-223136 A | 8/2003 |
|---|---|---|
| JP | 2003-223137 A | 8/2003 |
| JP | 2012-169460 A | 9/2012 |

* cited by examiner

Primary Examiner — Lex Malsawma
(74) Attorney, Agent, or Firm — Typha IP LLC (57) ABSTRACT

The display device includes a first organic electroluminescence element which includes an anode and a cathode which form a pair, and a light emitting layer which is formed between the anode and the cathode on a substrate. The light emitting layer includes a plurality of sub-light emitting layers which perform light emitting of colors which are respectively different. Each of the plurality of sub-light emitting layers is doped with a quantum dot light emitting material corresponding to a color to be emitted. A current with current density corresponding to a position of a sub-light emitting layer of a desired color among the plurality of sub-light emitting layers is injected to the light emitting layer, and the sub-light emitting layer of the desired color performs light emitting.

6 Claims, 10 Drawing Sheets

DISPLAY DEVICE

CROSS-REFERENCE TO RELATED APPLICATION

The present application claims priority from Japanese application JP 2014-177013, filed on Sep. 1, 2014, the content of which is hereby incorporated by reference into this application.

BACKGROUND OF THE INVENTION

1. Field of the Invention

The present invention relates to a display device including an organic electroluminescence element.

2. Description of the Related Art

A display device which includes an organic electroluminescence element (hereinafter, denoted by organic EL element) is used in an image display. In the display device including the organic EL element, higher definition has been required.

SUMMARY OF THE INVENTION

In general, when a display device including an organic light-emitting diode (OLED) is caused to have a higher definition, since it is necessary to create a pixel with a fine structure, a method of creating a pixel becomes more difficult.

In addition, as a structure which is advantageous in higher definition, there is a display device which includes a white organic EL element and a color filter (CF); however, there is a problem in that the power consumption of the display device becomes larger than a display device with another structure. In addition, there is a new problem in that it leads to high costs since it is necessary to include an additional member such as a color filter, and a color-mixing phenomenon occurs due to light leakage from an adjacent pixel, or the like.

The organic EL element in which the light emitting layer 5 is doped with the quantum dot light emitting material 11 is disclosed in JP 2012-169460 A. Normally, an emission spectrum using a quantum dot has a single peak, different from a luminous dopant which is used in an organic EL element, and it is possible to adjust a luminous color by changing the size of the quantum dot.

However, for the organic EL element which is described in JP 2012-169460 A, there is a description that the organic EL element may include a plurality of light emitting layers which perform respective light emission of red, green, and blue, for example. However, the organic EL element is an element for executing white light emission of which chromaticity is stable, and even when the organic EL element includes light emitting layers of a plurality of colors, there is no suggestion about a method in which a light emitting layer of a desired color is caused to emit light selectively. Therefore, it is difficult to perform the display of a color image using the display device which is disclosed in JP 2012-169460 A.

The present invention is made in consideration of the problem, and an object thereof is to provide a display device which successively performs higher definition.

(1) According to an aspect of the present invention, there is provided a display device including: a first organic electroluminescence element which includes an anode and a cathode which form a pair, and a light emitting layer which is formed between the anode and the cathode on a substrate. The light emitting layer includes a plurality of sub-light emitting layers which perform light emitting of colors which are respectively different. Each of the plurality of sub-light emitting layers is doped with a quantum dot light emitting material corresponding to a color to be emitted. A current with current density corresponding to a position of a sub-light emitting layer of a desired color among the plurality of sub-light emitting layers is injected to the light emitting layer, and the sub-light emitting layer of the desired color performs light emitting.

(2) In the display device according to (1) described above, the plurality of sub-light emitting layers may be stacked in line in order of high light emitting efficiency with respect to predetermined current density from the anode side to the cathode side.

(3) The display device according to (1) described above may further include: a second organic electroluminescence element which is close to the first organic electroluminescence element, and performs white light emitting. In the display device, one pixel may be formed of the first organic electroluminescence element and the second organic electroluminescence element.

(4) In the display device according to (1) described above, the respective sub-light emitting layers may perform any one of red light emitting, green light emitting, and blue light emitting.

DETAILED DESCRIPTION OF THE INVENTION

Hereinafter, each embodiment of the invention will be described with reference to drawings. In addition, a disclosure thereof is merely an example, and when an appropriate modification can be easily conceived by a person skilled in art without departing from the scope of the invention, it is naturally included in the scope of the invention. In addition, for more specific descriptions of drawings, there is a case in which a width, a thickness, a shape, or the like, of each unit is schematically denoted compared to a real state; however, it is merely an example, and does not limit the invention. In addition, in the specification and each drawing, the same elements as those which are described in the previous drawing are given the same reference numerals, and detailed description will be appropriately omitted.

First Embodiment

Figure 1:
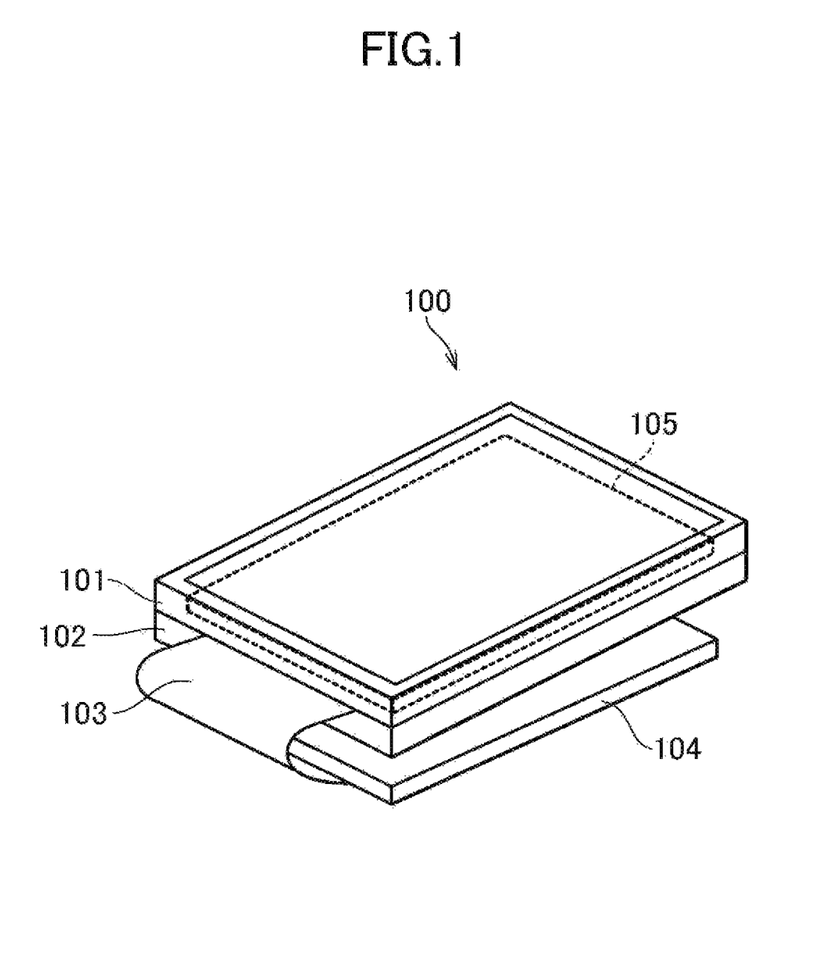
FIG. 1 is a diagram which illustrates a display device according to a first embodiment of the invention.

FIG. 1 is a diagram which illustrates a display device according to a first embodiment of the invention. The display device according to the embodiment is an organic EL display device 100. As illustrated in FIG. 1, the organic EL display device 100 is configured of an upper frame 101 and a lower frame 102 which are fixed so as to interpose an organic EL panel 105 therebetween, a circuit board 104 which includes a circuit element which generates information to be displayed, and a flexible board 103 which transmits RGB information generated in the circuit board to the organic EL panel 105.

Figure 2:
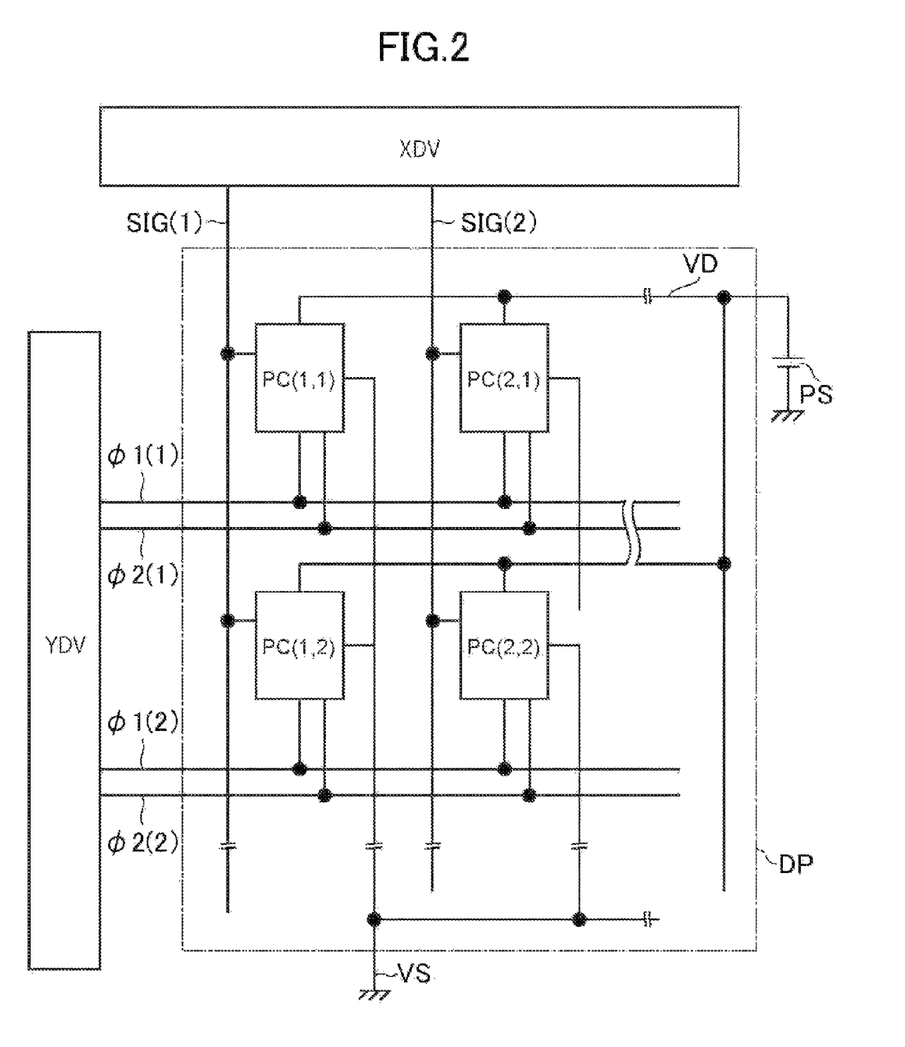
FIG. 2 is a diagram which illustrates an equivalent circuit of the display device according to the first embodiment of the invention.

FIG. 2 is a diagram which illustrates an equivalent circuit of the display device according to the embodiment. FIG. 2 particularly illustrates the organic EL panel 105 in the organic EL display device 100. The organic EL panel 105 includes a plurality of signal lines SIG which extend in the vertical direction in the figure, and are arranged in line in the horizontal direction, a plurality of first control lines $\phi 1$ which extend in the horizontal direction in the figure, and are arranged in line in the vertical direction, a plurality of second control lines $\phi 2$ which are arranged in parallel to the each of the first control lines $\phi 1$, a plurality of pixel circuits PC which are arranged in a matrix by corresponding to an intersection point of the signal line SIG and the first control line $\phi 1$ (second control line $\phi 2$), a signal line driving circuit XDV, and a scanning line driving circuit YDV. An upper end of the signal line SIG is connected to the signal line driving circuit XDV. The first control lines $\phi 1$ and the second control line $\phi 2$ are connected to the scanning line driving circuit YDV. The plurality of pixel circuits PC configure a display region DP. The signal line driving circuit XDV and the scanning line driving circuit YDV drive each pixel circuit PC in cooperation with each other.

A voltage source PS supplies a power supply voltage VD to a first voltage line which is connected thereto, and the first voltage line is connected to each pixel circuit PC. In addition, a second voltage line which is connected to a ground voltage GND is maintained at a reference voltage VS, and is connected to each pixel circuit PC. That is, according to the embodiment, the reference voltage VS is the ground voltage, and the power supply voltage VD is higher than the ground voltage; however, it is needless to say that there is no limitation to this. In addition, in FIG. 2, only four pixel circuits PC of 2×2 are denoted; however, pixel circuits PC of the number corresponding to a display resolution are present in practice. In general, a pixel circuit which is located at the nth row and the mth column is denoted by a pixel circuit PC (m, n). For example, a pixel circuit which is present on the upper left side is denoted by (1, 1). In addition, a signal line which is connected to a pixel circuit of the mth column is denoted by SIG(m), and the first control line and the second control line which are connected to a pixel circuit of the nth row are denoted by $\phi 1$ (n) and $\phi 2$ (n), respectively.

Figure 3:
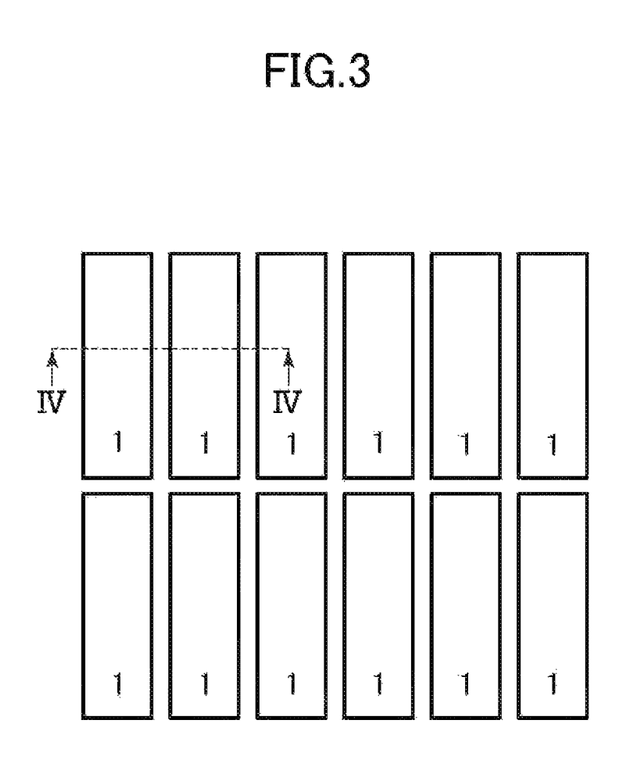
FIG. 3 is a schematic diagram of the display device according to the first embodiment of the invention.

FIG. 3 is a schematic diagram of the display device according to the embodiment. FIG. 3 schematically illustrates an organic EL element which is arranged in a display region DP, and pixels 1 are regularly arranged in line in the vertical direction and the horizontal direction. Each pixel 1 is one organic EL element (first organic electroluminescence element), and one pixel circuit PC illustrated in FIG. 2 includes the organic EL element, and a driving circuit which drives the organic EL element.

Figure 4:
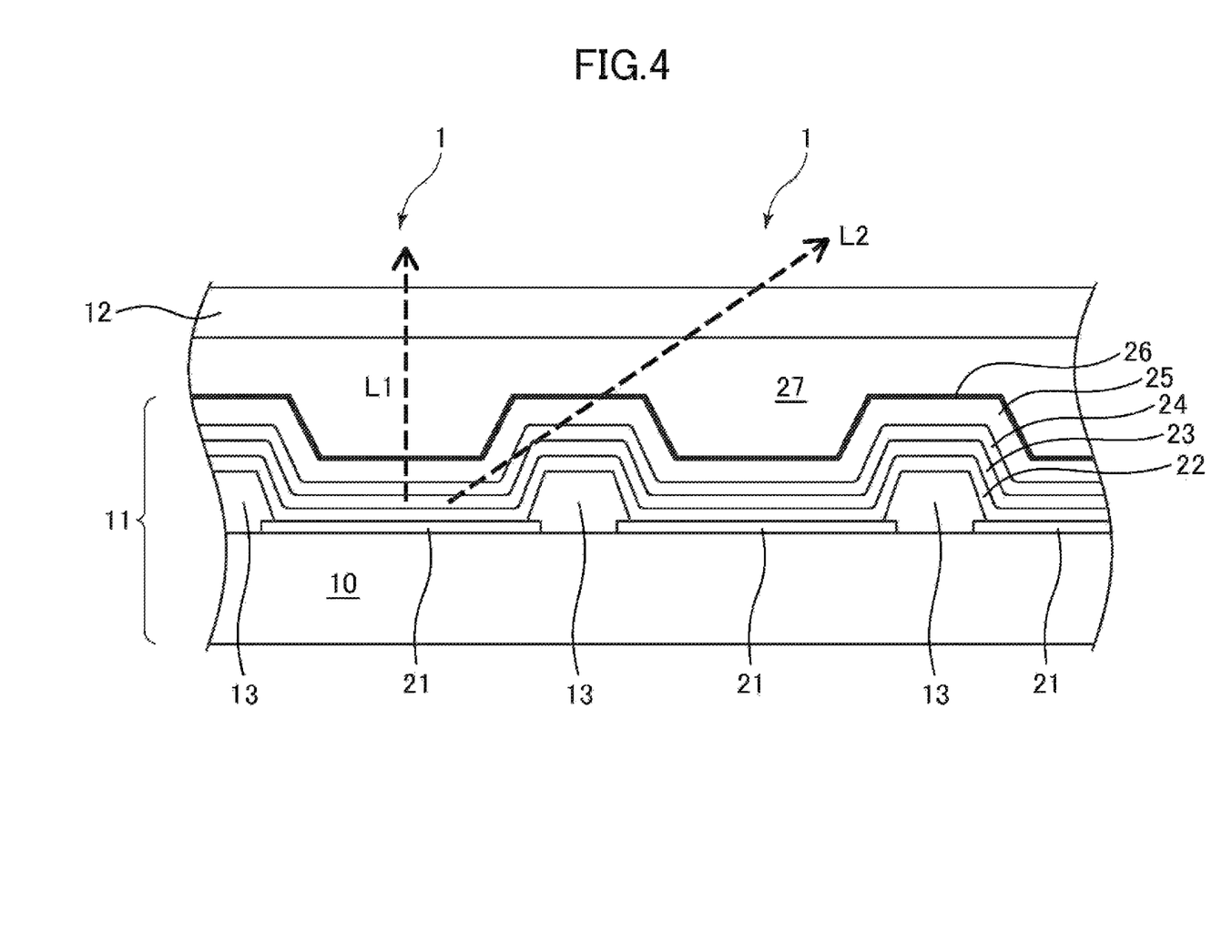
FIG. 4 is a sectional view of the display device according to the first embodiment of the invention.

FIG. 4 is a sectional view of the display device according to the embodiment. A section illustrated in FIG. 4 is a section of the organic EL panel 105, and is a section which is taken along line IV-IV in FIG. 3. As illustrated in the figure, the organic EL panel 105 includes an OLED substrate 11 and a sealing substrate 12. The OLED substrate 11 includes a glass substrate 10 and each layer, which will be described later, formed on the glass substrate. In addition, here, a material of the substrate which is a base of the OLED substrate 11 is set to glass, however, there is no limitation to this, and as a matter of course, another material such as plastic may be used. In the OLED substrate 11, on the glass substrate 10, an anode 21 in a predetermined shape is formed in each region corresponding to each sub-pixel, and banks 13 (pixel separation film) are respectively formed between adjacent anodes 21. A hole injection layer 22, a light emitting layer 23, an electron injection layer 24, a cathode 25, and a passivation film 26 are formed in order (top emission method) along the stacking direction on the entire face by covering the anode 21 and the bank 13. The anode 21 and the cathode 25 form a pair of electrodes, and the light emitting layer 23 is formed between the anode 21 and the cathode 25. The OLED substrate 11 is bonded to the sealing substrate 12 using a sealing adhesive (not illustrated) which is arranged at a frame region, and a sealing space 27 is formed between the OLED substrate 11 and the sealing substrate 12. The sealing space 27 is filled with dry nitrogen gas, for example.

A structure of the organic EL panel according to the embodiment is not limited to this, and it may be a configuration in which a hole transport layer is inserted between the hole injection layer 22 and the light emitting layer 23, and an electron transport layer is inserted between the light emitting layer 23 and the electron injection layer 24, respectively. In addition, the sealing substrate 12 may not be used when it is possible to secure strength or a sealing performance which is necessary depending on a specification of a product. In addition, here, the organic EL element is set to a top emission method; however, it may be another method such as a bottom emission method.

Figure 5:
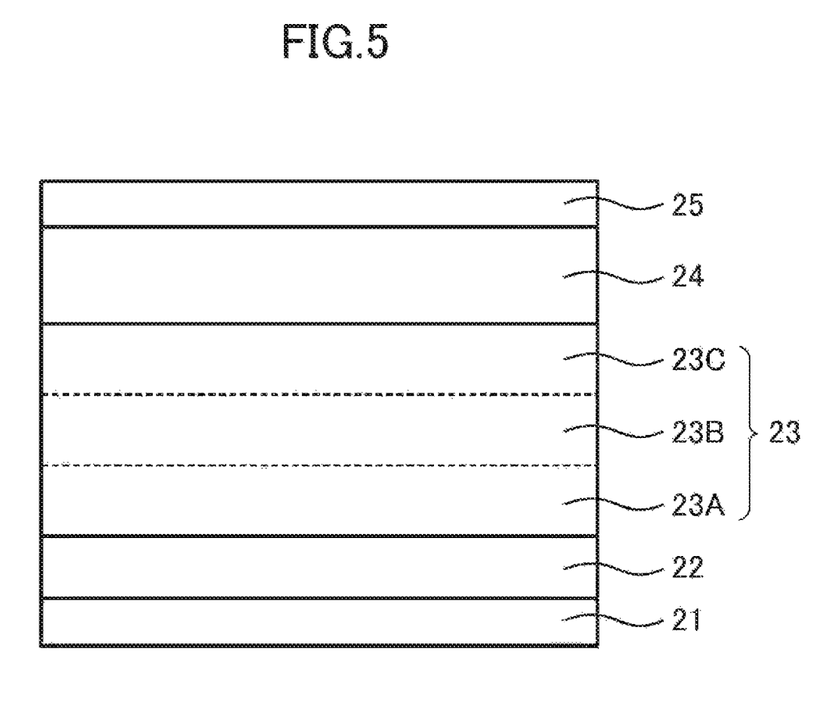
FIG. 5 is a schematic diagram which illustrates a structure of an organic EL element according to the first embodiment of the invention.

FIG. 5 is a schematic diagram which illustrates a structure of the organic EL element according to the embodiment. FIG. 5 schematically illustrates a section of the organic EL element which is illustrated in FIG. 4. In the display device according to the embodiment, the light emitting layer 23 has a multilayered structure which is formed of sub-light emitting layers of three levels. Here, the sub-light emitting layers of three levels are a sub-light emitting layer 23A, a sub-light emitting layer 23B, and a sub-light emitting layer 23C in order from the anode 21 side. Each sub-light emitting layer includes quantum dot light emitting materials with different sizes, and each sub-light emitting layer emits light of a color corresponding to the size. That is, the light emitting layer 23 includes a plurality of sub-light emitting layers which perform light emitting of colors which are different from each other. Each of the plurality of sub-light emitting layers is doped with a quantum dot light emitting material corresponding to a color to be emitted. For example, the sub-light emitting layer 23A is doped with the quantum dot light emitting material which performs blue light emitting, the sub-light emitting layer 23B is doped with the quantum dot light emitting material which performs green light emitting, the sub-light emitting layer 23C is doped with the quantum dot light emitting material which performs red light emitting. It is possible to form the quantum dot light emitting material using an electron beam lithography, a molecular beam epitaxy method in which a Stranski-Krastanov Growth Mode is used, a metal organic vapor phase growth method, a selective growth method in which a micro mask is used, or the like. In the quantum dot light emitting material, for example, CdSe, CdS, or CdTe may be used as a core, for example, organic molecules including nitrogen at a terminal end thereof may be used as a capping agent. A completed commercial product may be used as the quantum dot. The quantum dot light emitting material which is prepared in this manner may be contained in the light emitting layer 23 using vapor deposition or coating.

Main characteristics of the display device according to the embodiment of the invention are that the light emitting layer of the organic EL element (first organic electroluminescence element) includes a plurality of sub-light emitting layers which perform light emitting of colors which are different from each other and each of which is doped with a quantum dot light emitting material corresponding to a color to be emitted, and a current with a current density corresponding to a position of a sub-light emitting layer with a desired color is injected to the light emitting layer, among the plurality of sub-light emitting layers included in the light emitting layer, and the sub-light emitting layer with the desired color emits light. The invention was thought up when inventors found that, if current density of a current which flows in the light emitting layer of the organic EL element is changed, a carrier balance of holes and electrons in the element is changed, and a light emitting position in the light emitting layer is changed.

In general, the number of holes and electrons which are injected to the light emitting layer is different according to mobility of the hole injection layer and mobility of the electron injection layer, or an energy level of each interface. For that reason, when there is a change in the relationship in number between the number of holes and electrons, a recombination position of the hole and the electron in the light emitting layer shifts.

Figure 6:
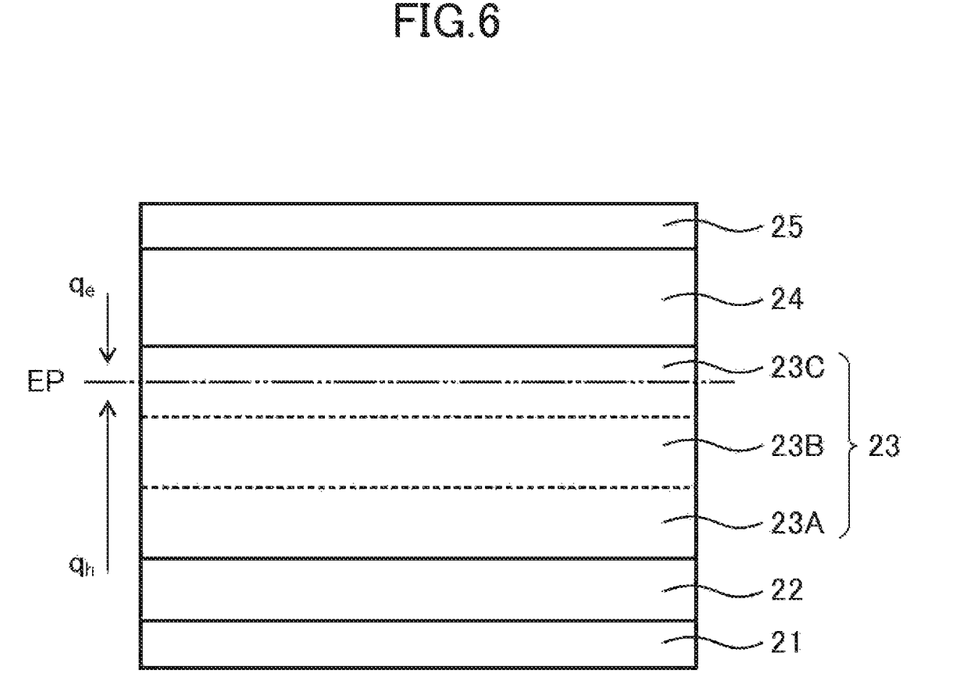
FIG. 6 is a diagram which illustrates a light emission state of the display device according to the first embodiment of the invention.
Figure 7:
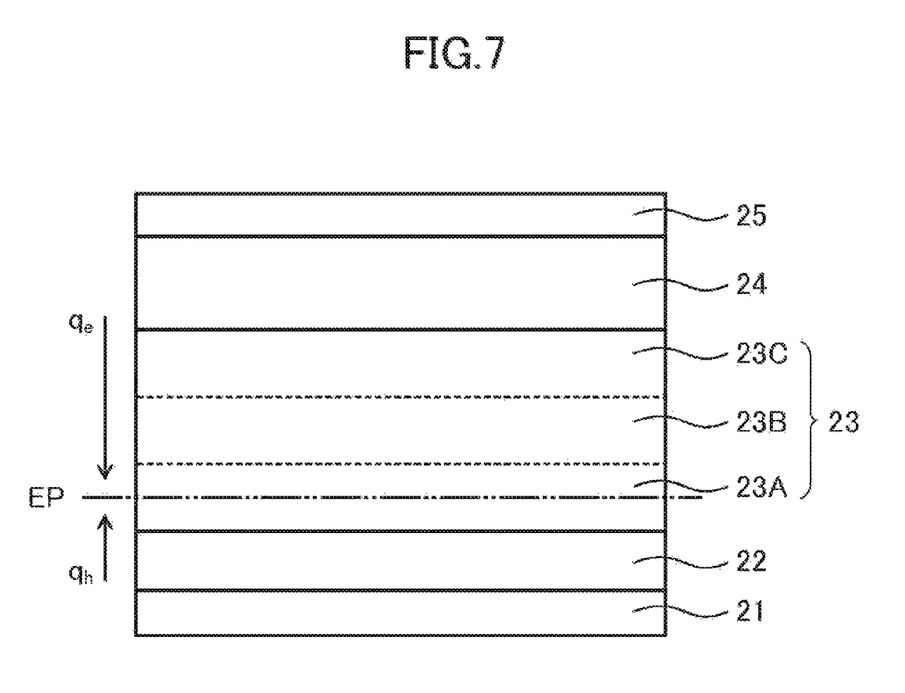
FIG. 7 is a diagram which illustrates a light emission state of the display device according to the first embodiment of the invention.

FIGS. 6 and 7 are diagrams which illustrate light emitting states of the display device according to the embodiment. In FIG. 6, a case in which the number of holes $q_h$ is larger than the number of electrons $q_e$ is illustrated, and in FIG. 7, a case in which the number of holes $q_h$ is smaller than the number of electrons $q_e$ is illustrated, respectively. As illustrated in FIGS. 6 and 7, when the number of holes $q_h$ is larger than the number of electrons $q_e$ along the stacking direction (vertical direction in figure), recombination is performed at a position which is close to the cathode 25 side in the light emitting layer 23, and when the number of holes $q_h$ is smaller than the number of electrons $q_e$, recombination is performed at a position which is close to the anode 21 side. In addition, when the number of holes $q_h$ and the number of electrons $q_e$ are the same as each other, recombination is performed at a position in the vicinity of the center along the stacking direction in the light emitting layer 23.

The light emitting layer 23 according to the embodiment includes the sub-light emitting layers 23A, 23B, and 23C which are stacked in order along the stacking direction from the anode 21 side to the cathode 25 side. Due to a relationship in number between the holes $q_h$ and the electrons $q_e$, a recombination position, that is, a light emitting position EP shifts. Accordingly, the light emitting position EP (center thereof) can be set to the sub-light emitting layer 23C when the number of holes $q_h$ is larger than the number of electrons $q_e$, the light emitting position EP (center thereof) can be set to the sub-light emitting layer 23B when the number of holes $q_h$ is the same as the number of electrons $q_e$, and the light emitting position EP (center thereof) can be set to the sub-light emitting layer 23A when the number of holes $q_h$ is smaller than the number of electrons $q_e$. That is, for example, it is possible to set so that blue light emission is performed when the number of holes $q_h$ is larger than the number of electrons $q_e$, green light emission is performed when the number of holes $q_h$ is the same as that of the electrons $q_e$, and red light emission is performed when the number of holes $q_h$ is smaller than the number of electrons $q_e$.

Figure 8A:
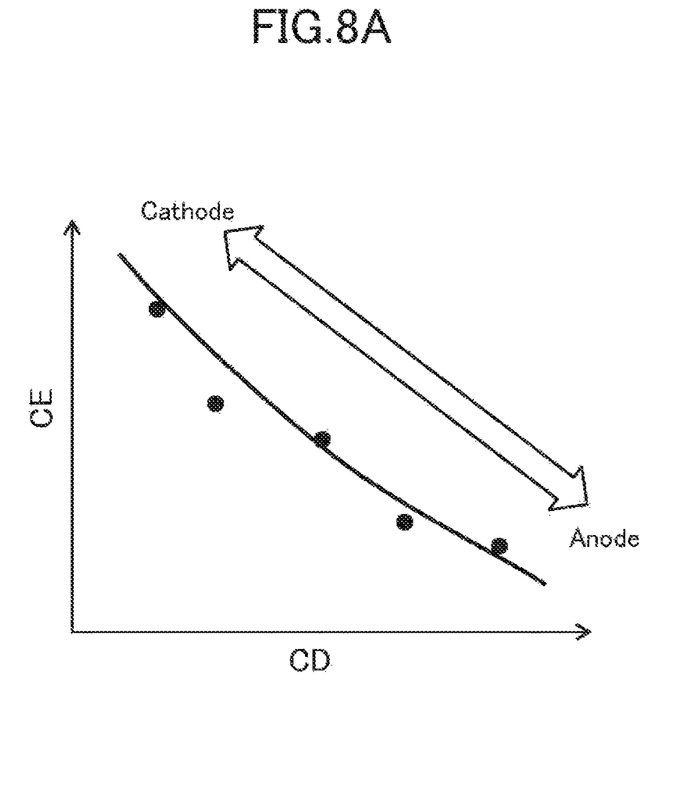
FIG. 8A is a diagram which illustrates an evaluation result of dependency of current efficiency on current density.
Figure 8B:
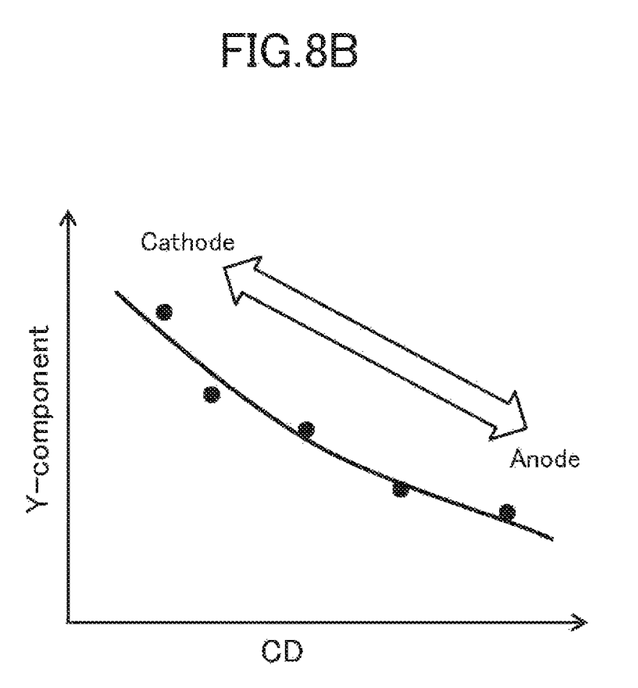
FIG. 8B is a diagram which illustrates an evaluation result of dependency of chromaticity on current density.

FIG. 8A is a diagram which illustrates an evaluation result of dependency of current efficiency (CE) on current density (CD), and FIG. 8B is a diagram which illustrates an evaluation result of dependency of chromaticity (y-component) on current density (CD). Here, the current density is current density of a current which flows in the light emitting layer, and it is possible to control the current density using a voltage applied between the anode and the cathode. That is, in the embodiment, it is possible to control current density of a current which flows in the light emitting layer by adjusting a power supply voltage VD which is supplied to the first voltage line by the voltage source PS illustrated in FIG. 2. In addition, chromaticity illustrated in FIG. 8B is a y value (y-component) of chromaticity coordinates (x-y coordinates).

Dots (•) illustrated in FIGS. 8A and 8B denote measured data when current density is changed. In contrast to this, solid lines illustrated in FIGS. 8A and 8B are results of a calculation of change in optical interference when a light emitting position is intentionally changed from the cathode side to the anode side along the stacking direction in the light emitting layer, by performing an optical simulation. As a result, the measured data (•) matches a prediction from the result of optical simulation (solid line). As described above, inventors found that it is possible to arbitrarily set a recombination position, that is, the light emitting position EP by controlling current density of a current which flows in the light emitting layer 23 by using the properties. In this manner, in the organic EL element according to the embodiment, it is possible to perform light emission of a desired color by injecting a current with current density corresponding to a position of a sub-light emitting layer of the desired color among the plurality of sub-light emitting layers, to the light emitting layer.

The display device according to the embodiment is driven due to color field sequential (time division for color) driving. When a period in which one screen is displayed is set to one frame period in a certain pixel 1, one frame period is divided into display periods of a plurality of colors (subframe period) in color field sequential driving, and a gradation display is performed by controlling a width of light emitting time of the color in the display period of each color. The driving is disclosed in JP 2003-223136 A, and JP 2003-223137 A, for example.

Since it is possible to perform multicolored light emitting in one pixel by synchronizing the color field sequential driving and a control of the power supply voltage VD, it is possible for the display device according to the embodiment to perform a color image display. In addition, as illustrated in FIGS. 8A and 8B, when current density is increased, light emitting efficiency decreases. Accordingly, it is possible to perform full color display by adjusting light emission duty (length of light emitting period) according to the light emitting efficiency of each sub-light emitting layer, and desired luminance.

In addition, the plurality of sub-light emitting layers which perform light emitting of colors which are different from each other will be taken into consideration. In general, light emitting efficiency of the plurality of sub-light emitting layers are different with respect to a certain (same) current density. In addition, when current density is increased in a sub-light emitting layer which performs light emitting of a certain color, light emitting efficiency decreases. Therefore, in the light emitting layer 23, it is preferable that the plurality of sub-light emitting layers are stacked so as to align from the anode 21 side to the cathode 25 side in order of high light emitting efficiency. Here, a predetermined current density is a typical value of distribution of current density (range) which is appropriate for the plurality of sub-light emitting layers, respectively, to perform light emitting, and for example, is a mean value, a median value, a mode value, or the like, of the optimal current density of each of the plurality of sub-light emitting layers. As illustrated in FIG. 7, the light emitting layer 23 according to the embodiment is configured of the sub-light emitting layers 23A, 23B, and 23C of three levels which are stacked in line from the anode 21 side to the cathode 25 side in order. In addition, the sub-light emitting layers of three different colors are set to sub-light emitting layers of a first color, a second color, and a third color in order of high light emitting efficiency with respect to predetermined current density. The invention has a remarkable effect by configuring the sub-light emitting layer 23A which is closest to the anode 21 side as a sub-light emitting layer of the first color (first color sub-light emitting layer), the sub-light emitting layer 23B as a sub-light emitting layer of the second color (second color sub-light emitting layer), and the sub-light emitting layer 23C which is closest to the cathode 25 side as a sub-light emitting layer of the third color (third color sub-light emitting layer). When the sub-light emitting layer 23A which is closest to the anode 21 side, and of which light emitting efficiency is lowest is configured as the first color sub-light emitting layer, a decrease in light emitting efficiency is suppressed in the whole light emitting layer 23, compared to a case in which the sub-light emitting layer 23A is configured of a sub-light emitting layer of another color (second color or third color). Accordingly, due to the arrangement, it is possible to reduce a difference in light emission duty which is used in light emitting of different colors, and it is easy to control a full color display.

Since it is possible to perform a display of a plurality of colors in one pixel in the display device 1 according to the embodiment of the invention, it is possible to realize higher definition compared to the display device of a pixel configuration (SBS (Side by Side: color adjacency) structure) in which one pixel is provided from subs-pixels of a plurality of colors. Accordingly, the display device is optimum for an organic EL display device for a smart phone, a tablet, a slim-type TV, or the like. When light emitting of a corresponding color is performed in each sub-pixel, it is necessary to pattern a light emitting layer in each luminous color, and a limit in alignment precision occurs when performing patterning, along with a reduction in pixel size. In addition, in a light emitting material which is used in an organic EL element in the related art, light emitting materials of different colors are doped in the same layer or in an adjacent layer, and there is a problem in that energy transfer easily occurs. However, in the display device according to the embodiment of the invention, it is not necessary to pattern the light emitting layer in each luminous color, and it is possible to realize higher definition. In addition, a quantum dot is used in the light emitting material according to the embodiment of the invention, energy transfer is remarkably suppressed, and image quality is improved.

In addition, when a white color light emitting layer and a color filter are formed in each sub-pixel, a color mixing phenomenon can occur between adjacent sub-pixels. FIG. 4 illustrates a light emitting component L1 which is emitted from the light emitting layer 23 along the stacking direction. FIG. 4 further illustrates a light emitting component L2 in a direction which obliquely intersects the stacking direction. When a color filter is used, the light emitting component L2 enters an adjacent sub-pixel, passes through a color filter of the adjacent sub-pixel, and causes a color mixing phenomenon. When a pixel becomes a high definition pixel, a solid angle in a region of light which does not proceed to a color filter of an adjacent sub-pixel among light beams which are emitted from the light emitting layer becomes small, and a color mixing phenomenon becomes more remarkable. However, in the display device according to the embodiment of the invention, since it is not necessary to pattern a color filter, and high accuracy is not necessary when bonding the OLED substrate 11 and the sealing substrate 12, it is possible to realize higher definition.

Second Embodiment

Figure 9:
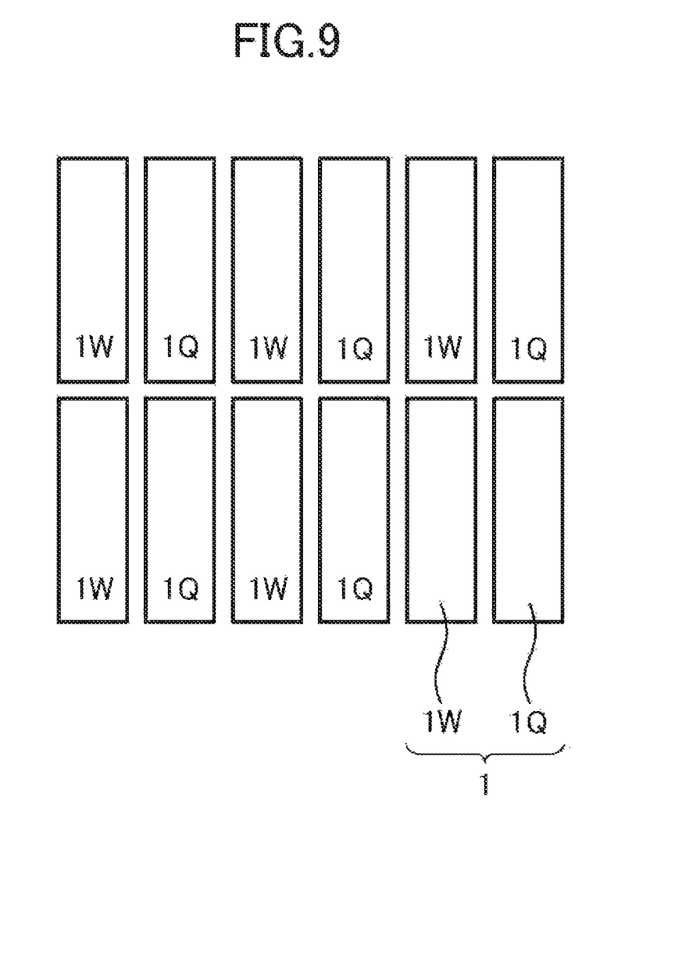
FIG. 9 is a schematic diagram of a display device according to a second embodiment of the present invention.

FIG. 9 is a schematic diagram of a display device according to a second embodiment of the invention. One pixel 1 includes a sub-pixel 1W and a sub-pixel 1Q which are adjacent to each other. Here, a well-known white organic EL element (second organic electroluminescence element) which emits white light is used in the sub-pixel 1W, and a quantum dot light emitting material is doped in the light emitting layer 23 of the sub-pixel 1Q. That is, the pixel 1 is formed by the first organic electroluminescence element and the second organic electroluminescence element. A structure of the sub-pixel 1Q has the same structure as the pixel 1 (organic EL element) illustrated in FIG. 3. A configuration of the organic EL panel other than that is the same as that in the first embodiment.

In the display device according to the first embodiment, one pixel 1 performs color adjustment and luminance adjustment due to color field sequential driving. In the display device according to the embodiment, it is possible to make the sub-pixel 1W which emits white light contribute to luminance adjustment since one pixel 1 includes the sub-pixel 1W and the sub-pixel 1Q, and it is possible to exhibit the remarkable effect that a display device with lower power consumption can be realized, in addition to the effect which is exhibited by the display device according to the first embodiment. Here, since the sub-pixel 1W contributes to luminance adjustment, the sub-pixel 1Q may mainly perform color adjustment, and it is possible to cause two sub-pixels to share roles.

Here, the sub-pixel 1W is configured of a white organic EL element; however, the sub-pixel may be created using the same structure as that of the organic EL element which configures the sub-pixel 1Q. White light may be emitted by causing the sub-pixel 1W to be subjected to the color field sequential driving, similar to the sub-pixel 1Q, and mixing light beams of a plurality of colors. In the display device, since the sub-pixel 1W and the sub-pixel 1Q have the same structure as each other, it is possible to exhibit the remarkable effect that manufacturing processes become easier.

Hitherto, the display device according to the embodiment of the invention has been described; however, the display device according to the invention is not limited to the above described embodiments. In a category of the idea of the invention, a person skilled in art can conceive various modification examples, and it is understood that the modification examples are included in the scope of the invention. For example, the addition or deletion of a constituent element, a change in design, the addition or omission of a process, or a change in conditions which is appropriately performed by a person skilled in art with respect to each of the above described embodiments is also included in the scope of the invention when including the gist of the invention.

While there have been described what are, at present, considered to be certain embodiments of the invention, it will be understood that various modifications may be made thereto, and it is intended that the appended claims cover all such modifications that fall within the true spirit and scope of the invention.

What is claimed is:

1. A display device comprising:
   a first organic electroluminescence element, including:
      an anode and a cathode which form a pair;
      a light emitting layer which is formed between the anode and the cathode on a substrate, the light emitting layer including a plurality of sub-light emitting layers which are stacked along a stacking direction from the anode to the cathode, the plurality of sub-light emitting layers configured to perform light emitting of colors which are respectively different according to a position along the stacking direction due to recombination of a hole and an electron depending on a current density of a current flowing in the light emitting layer, each of the plurality of sub-light emitting layers being doped with a quantum dot light emitting material corresponding to a color to be emitted; and
      a bank which surrounds the anode for pixel separation; and
   a voltage line, providing a voltage for controlling the current density of the current flowing in the light emitting layer,
   wherein the current with current density corresponding to a position along the stacking direction of a sub-light emitting layer of a desired color among the plurality of sub-light emitting layers is injected to the light emitting layer, and the sub-light emitting layer of the desired color performs light emitting, and
   wherein the plurality of sub-light emitting layers are formed covering the anode and the bank.

2. The display device according to claim 1,
   wherein the plurality of sub-light emitting layers are stacked along the stacking direction in order of high light emitting efficiency with respect to predetermined current density from the anode to the cathode.

3. The display device according to claim 1, further comprising:
   a second organic electroluminescence element which is close to the first organic electroluminescence element, and performs white light emitting,
   wherein one pixel is formed of the first organic electroluminescence element and the second organic electroluminescence element.

4. The display device according to claim 1,
   wherein the plurality of sub-light emitting layers include three layers.

5. The display device according to claim 4,
   wherein the three layers are for emitting red light, green light, and blue light, respectively.

6. The display device according to claim 5,
   wherein the three layers overlap the bank.

* * * * *